(12) United States Patent
Li et al.

(10) Patent No.: US 10,622,386 B2
(45) Date of Patent: Apr. 14, 2020

(54) SUBSTRATE, CHIP ON FILM AND ELECTRONIC EQUIPMENT

(71) Applicant: BOE TECHNOLOGY GROUP CO., LTD., Beijing (CN)

(72) Inventors: Hong Li, Beijing (CN); Liqiang Chen, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 74 days.

(21) Appl. No.: 15/504,628

(22) PCT Filed: May 18, 2016

(86) PCT No.: PCT/CN2016/082420
§ 371 (c)(1),
(2) Date: Feb. 16, 2017

(87) PCT Pub. No.: WO2017/140055
PCT Pub. Date: Aug. 24, 2017

(65) Prior Publication Data
US 2018/0108682 A1 Apr. 19, 2018

(30) Foreign Application Priority Data
Feb. 17, 2016 (CN) .......................... 2016 1 0090050

(51) Int. Cl.
*H05K 1/11* (2006.01)
*H01L 23/538* (2006.01)
(Continued)

(52) U.S. Cl.
CPC ...... *H01L 27/1244* (2013.01); *G02F 1/13452* (2013.01); *H01L 23/5386* (2013.01);
(Continued)

(58) Field of Classification Search
CPC ............. H01L 23/5386; H01L 23/5387; H01L 27/1218; H01L 27/1244; G02F 1/13452;
(Continued)

(56) References Cited

U.S. PATENT DOCUMENTS 5,951,304 A * 9/1999 Wildes .................. B81B 7/0006
174/261
6,403,895 B1 * 6/2002 Sota .................. H01L 23/49816
174/260
(Continued)

FOREIGN PATENT DOCUMENTS

CN 101510383 A 8/2009
CN 105301851 A 2/2016
(Continued)

OTHER PUBLICATIONS

Office Action in Chinese Application No. 201610090050.2 dated Jul. 20, 2017, with English translation.
(Continued)

*Primary Examiner* — Hoa C Nguyen
(74) *Attorney, Agent, or Firm* — Womble Bond Dickinson (US) LLP

(57) ABSTRACT

The embodiments of the present invention provide a substrate, a chip on film and an electronic equipment. The substrate includes a plurality of first bonding pads arranged side by side along a first direction. Each first bonding pad has a first side edge and a second side edge arranged oppositely, which are arranged along the first direction. A third side edge and a fourth side edge of the first bonding pad are arranged oppositely and arranged along a second direction perpendicular to the first direction. The first side edge and second side edge of each first bonding pad are not parallel to each other.

12 Claims, 2 Drawing Sheets

(51) Int. Cl.
*H01L 27/12* (2006.01)
*G02F 1/1345* (2006.01)
*G06F 3/041* (2006.01)

(52) U.S. Cl.
CPC ...... *H01L 23/5387* (2013.01); *H01L 27/1218* (2013.01); *G06F 3/0412* (2013.01); *G06F 2203/04102* (2013.01); *H05K 1/111* (2013.01); *H05K 2201/094* (2013.01)

(58) Field of Classification Search
CPC ........ G06F 3/0412; G06F 2203/04102; H05K 1/111; H05K 2201/094
USPC ......................................................... 361/767
See application file for complete search history.

(56) References Cited

U.S. PATENT DOCUMENTS

| | | | | |
|---|---|---|---|---|
| 7,419,380 | B2* | 9/2008 | Yamada | H05K 1/0269 349/149 |
| 2001/0029118 | A1* | 10/2001 | Ota | H05K 3/363 439/65 |
| 2007/0117415 | A1* | 5/2007 | Shikina | G02F 1/13338 439/55 |
| 2014/0198462 | A1 | 7/2014 | Chiu et al. | |
| 2014/0321088 | A1* | 10/2014 | Bae | H05K 1/117 361/767 |
| 2015/0366049 | A1* | 12/2015 | Lee | G02F 1/13458 361/749 |

FOREIGN PATENT DOCUMENTS

| | | |
|---|---|---|
| CN | 105529339 A | 4/2016 |
| CN | 205376526 U | 7/2016 |

OTHER PUBLICATIONS

Office Action received for Chinese Patent Application No. 201610090050.2, dated Jan. 19, 2018, 17 pages (10 pages of English Translation and 7 pages of Office Action).

International Search Report and Written Opinion PCT/CN2016/082420 dated Oct. 28, 2016, with English translation. 18 pages.

Office Action received for Chinese Patent Application No. 201610090050.2, dated Jun. 13, 2018, 12 pages (6 pages of English Translation and 6 pages of Office Action).

International Preliminary Report on Patentability received for PCT Patent Application No. PCT/CN2016/082420, dated Aug. 30, 2018, 14 pages (8 pages of English Translation and 6 pages of Original Document).

* cited by examiner

SUBSTRATE, CHIP ON FILM AND ELECTRONIC EQUIPMENT

RELATED APPLICATIONS

The present application is the U.S. national phase entry of the international application PCT/CN2016/082420, with an international filing date of May 18, 2016, which claims the benefit of Chinese Patent Application No. 201610090050.2, filed on Feb. 17, 2016, the entire disclosures of which are incorporated herein by reference.

TECHNICAL FIELD

The present invention relates to the field of display technology, in particular to a substrate, a chip on film and an electronic equipment.

BACKGROUND

The flat panel display is the most popular display, which is widely used in the computer screen, mobile phone and other electronic products because of its characteristics of thin, light, energy saving and no radiation.

A display device mainly includes a color film substrate, an array substrate and a chip on film (COF). The array substrate is provided with a display area for displaying and a bonding area located at the periphery of the display area. A terminal of a lead wire in the display area (i.e., a bonding pad) is located in the bonding area. A surface of the chip on film is provided with a lead wire and a chip. One terminal of the lead wire on the chip on film is connected to the chip, the other terminal of this lead wire is also provided with a bonding pad. The bonding pad on the chip on film is bonded to the bonding pad of the bonding area on the array substrate, the signal from the chip can then be provided to the lead wire of the array substrate through the lead wire of the chip on film, realizing display in the display area.

SUMMARY

The inventor finds out that if the substrate (array substrate or touch control substrate) is a flexible substrate (i.e., the base of the substrate being made of a flexible material, such as an organic material of PI, PET etc.), other layers and via holes formed on the flexible substrate may cause the deformation of the flexible substrate. In such a situation, during bonding the bonding pad on the chip on film to the bonding pad on the substrate, misalignment and dislocation may occur, causing a weak combination for these two bonding pads or a short circuit between adjacent bonding pads.

Aiming at the defects of the existing electronic equipment such as the display device, the embodiments of the present invention provide a substrate, a chip on film and an electronic equipment having a tolerance for the variations of expansion and contraction.

An embodiment of the present invention provides a substrate. The substrate includes a plurality of first bonding pads arranged side by side along a first direction. Each first bonding pad has a first side edge and a second side edge arranged oppositely, which are arranged along the first direction. A third side edge and a fourth side edge of the first bonding pad are arranged oppositely and arranged along a second direction perpendicular to the first direction. The first side edge and second side edge of each first bonding pad are not parallel to each other.

Optionally, directly adjacent first side edge and second side edge respectively belonging to each of two adjacent first bonding pads are arranged parallel to each other.

Optionally, a shape of each first bonding pad gradually widens along the second direction.

Optionally, a shape of each first bonding pad gradually narrows along the second direction.

Optionally, the third side edge and the fourth side edge of each first bonding pad are parallel to each other.

Optionally, the third side edges of all the first bonding pads are located on a straight line, the fourth side edges of all the first bonding pads are located on another straight line.

Optionally, a substratum for the substrate is a flexible substratum.

Optionally, the substrate is an array substrate.

Optionally, the substrate is a touch control substrate.

An embodiment of the present invention also provides a chip on film. The chip on film includes a plurality of second bonding pads arranged side by side along a third direction. Each second bonding pad has a first side edge and a second side edge arranged oppositely, which are arranged along the third direction. A third side edge and a fourth side edge of the second bonding pad are arranged oppositely and arranged along a fourth direction perpendicular to the third direction. The first side edge and second side edge of each second bonding pad are not parallel to each other.

Optionally, directly adjacent first side edge and second side edge respectively belonging to each of two adjacent second bonding pads are arranged parallel to each other.

Optionally, a shape of each second bonding pad gradually widens along the fourth direction.

Optionally, a shape of each second bonding pad gradually narrows along the fourth direction.

Optionally, the third side edge and the fourth side edge of each second bonding pad are parallel to each other.

Optionally, the third side edges of all the second bonding pads are located on a straight line, the fourth side edges of all the second bonding pads are located on another straight line.

An embodiment of the present invention also provides an electronic equipment. The electronic equipment includes the substrate and the chip on film in the abovementioned embodiments. The substrate is bonded to the plurality of second bonding pads of the chip on film through the plurality of first bonding pads. The shapes and distribution of the plurality of first bonding pads are the same with the shapes and distribution of the plurality of second bonding pads respectively.

Optionally, the first direction and the third direction are the same, the second direction and the fourth direction are the same.

Optionally, the substrate is an array substrate or a touch control substrate.

In the embodiments of the invention, the first side edge and second side edge of each first bonding pad on the substrate are mutually inclined, rather than parallel to each other, therefore short circuit can be avoided effectively during the bonding process.

In some embodiments, a shape of each first bonding pad gradually widens or narrows along a direction from the third side edge to the fourth side edge.

In some embodiments of the invention, the shape of each first bonding pad widens gradually along a direction from the third side edge to the fourth side edge. The shapes of the second bonding pads are the same with the shapes of the first bonding pads. When a deformation of outward extension along the X direction occurs in the substrate, the length of the substrate in the Y direction is substantially shortened, the first bonding pads on the substrate thus move upwards along the Y direction with respect to the second bonding pads on the chip on film. Since the shape of each first bonding pad widens gradually along the direction from the third side edge to the fourth side edge, the first bonding pads can still be bonded to the second bonding pads of the chip on film very well. Similarly, when a deformation of inward contraction along the X direction occurs in the substrate, the length of the substrate in the Y direction is substantially lengthened, the first bonding pads on the substrate thus move downwards along the Y direction with respect to the second bonding pads on the chip on film. Since the shape of each second bonding pad widens gradually along the direction from the third side edge to the fourth side edge, the first bonding pads can still be bonded to the second bonding pads of the chip on film very well.

REFERENCE SIGNS

1—first bonding pad; 2—second bonding pad; Q1—display area; Q2—bonding area.

DETAILED DESCRIPTION OF THE INVENTION

In the following, the technical solutions in embodiments of the invention will be described clearly and completely in connection with the drawings in the embodiments of the invention.

Unless otherwise specified, the technical terms or scientific terms used in the embodiments of the present invention should be of general significance to those skilled in the field of the invention. The "first", "second" and similar words used in the embodiments of the present invention do not represent any order, quantity, or importance, but are used to distinguish different elements. The word such as "include" or "comprise" indicates that the element or object preceding the word encompasses the subsequent elements or objects and their equivalent, and does not exclude other elements or objects. The words "over", "under", "left", "right", "row" and "column" are only used for indicating relative position relationship. If the absolute position of the described object is changed, the relative position relationship may also be changed accordingly.

In order to clearly describe the embodiment of the present invention, an array substrate is used as an example of the "substrate", and a display device is used as an example of the "electronic equipment". Those skilled in the art can understand that the substrate (such as an array substrate and a touch control substrate) in an electronic device such as a display device can apply the same bonding pad structure.

Figure 1:
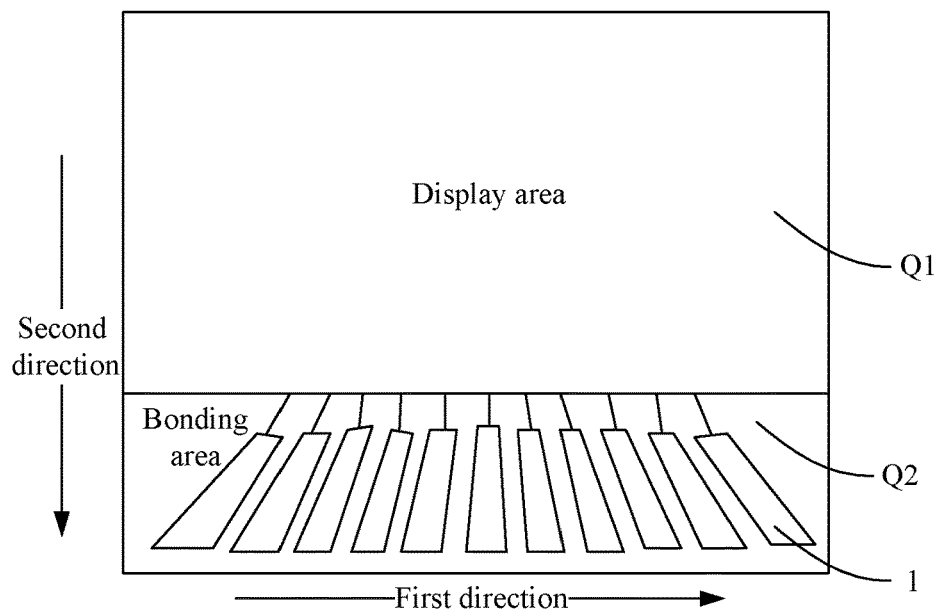
FIG. 1 is a schematic diagram of a substrate according to an embodiment of the invention.
Figure 2:
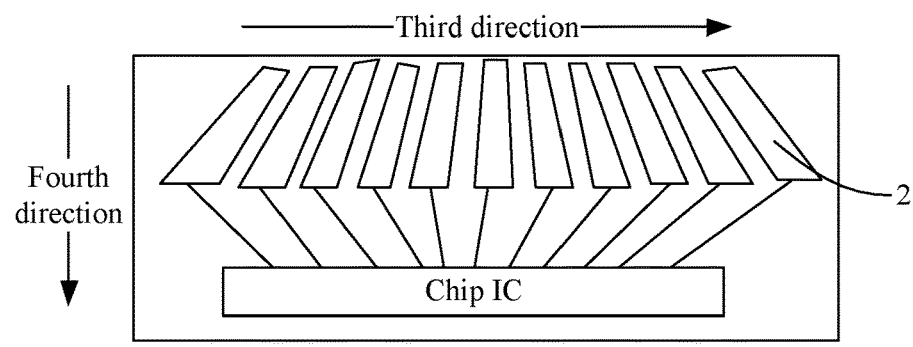
FIG. 2 is a schematic diagram of a chip on film according to an embodiment of the invention.

An embodiment of the present invention provides a display device. The display device includes an array substrate (shown in FIG. 1) and a chip on film (shown in FIG. 2). The substrate includes a display area Q1 for displaying and a bonding area Q2 located at the periphery of the display area Q1. A plurality of first bonding pads 1 are arranged in the bonding area Q2. The plurality of first bonding pads 1 are arranged side by side along a first direction. Each first bonding pad 1 has a first side edge and a second side edge arranged oppositely, which are arranged along the first direction. A third side edge and a fourth side edge of the first bonding pad are arranged oppositely and arranged along a second direction perpendicular to the first direction. The first side edge and second side edge of each first bonding pad 1 are not parallel to each other. It can be understood that the shapes of the second bonding pads 2 on the chip on film match the shapes of the first bonding pads 1 on the array substrate. That is, the chip on film includes a plurality of second bonding pads 2 arranged side by side along a third direction. Each second bonding pad 2 has a first side edge and a second side edge arranged oppositely and arranged along the third direction. A third side edge and a fourth side edge of the second bonding pad 2 are arranged oppositely and arranged along a fourth direction perpendicular to the third direction. The first side edge and second side edge of each second bonding pad 2 are not parallel to each other.

It should be noted that the first side edge, the second side edge, the third side edge and the fourth side edge of the first bonding pad 1 respectively refer to the left side edge, the right side edge, the upper side edge and the lower side edge in the drawing.

In the embodiments of the invention, the first side edge and second side edge of each first bonding pad 1 are mutually inclined, rather than parallel to each other. That is, the shape of each first bonding pad 1 gradually widens or narrows along the direction from the third side edge to the fourth side edge (i.e., the direction away from the display area). In the following, an embodiment is illustrated, in which the shape of each first bonding pad 1 gradually widens along the direction from the third side edge to the fourth side edge.

Figure 4:
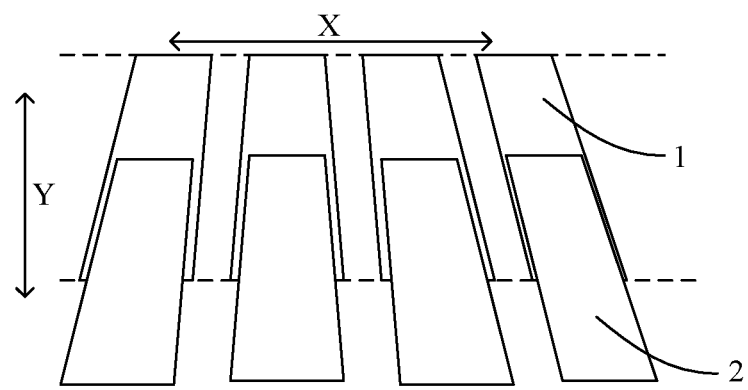
FIG. 4 is a schematic diagram showing outward extension of the substrate according to an embodiment of the invention.

In particular, as shown in FIG. 4, the shape of each first bonding pad 1 gradually widens along the direction from the third side edge to the fourth side edge (i.e., from top to bottom along the Y direction). The shapes of the second bonding pads 2 are the same with the shapes of the first bonding pads 1. During the manufacturing process, when a deformation of outward extension along the X direction occurs in the array substrate, a deformation of inward contraction along the Y direction occurs in the array substrate. When the first bonding pads 1 of the array substrate are being bonded to the second bonding pads 2 of the chip on film, due to the abovementioned deformation, the first bonding pads 1 on the array substrate move upwards along the Y direction with respect to the second bonding pads 2 on the chip on film. It can be seen that the relatively wide portions of the first bonding pads 1 are exactly bonded to the relatively narrow portions of the second bonding pads 2, then the first bonding pads 1 can still be bonded to the second bonding pads 2 very well.

Figure 5:
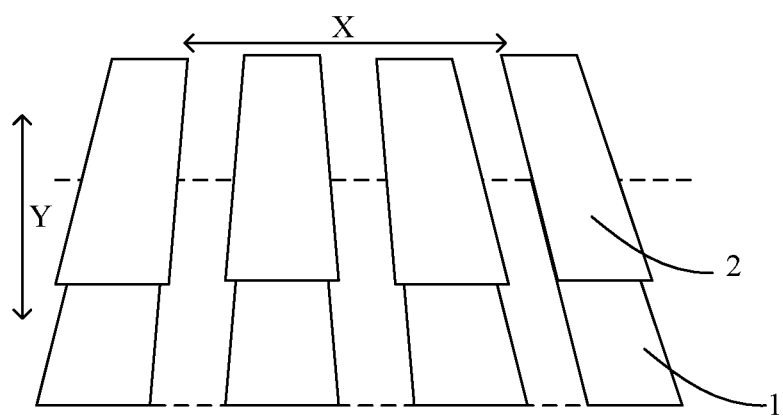
FIG. 5 is a schematic diagram showing inward contraction of the substrate according to an embodiment of the invention.

Similarly, as shown in FIG. 5, during the manufacturing process, when a deformation of inward contraction along the X direction occurs in the array substrate, a deformation of outward extension along the Y direction occurs in the array substrate. When the first bonding pads 1 of the array substrate are being bonded to the second bonding pads 2 of the chip on film, due to the abovementioned deformation, the first bonding pads 1 on the array substrate move downwards along the Y direction with respect to the second bonding pads 2 on the chip on film. It can be seen that the relatively narrow portions of the first bonding pads 1 are exactly bonded to the relatively wide portions of the second bonding pads 2, then the first bonding pads 1 can still be bonded to the second bonding pads 2 very well.

Figure 3:
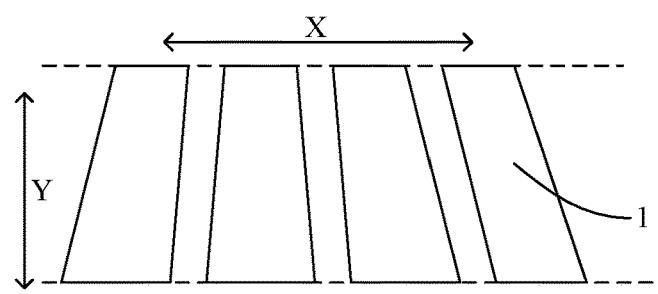
FIG. 3 is a schematic diagram showing an arrangement of the first bonding pads on the substrate according to an embodiment of the invention.

As shown in FIG. 3, directly adjacent first side edge and second side edge respectively belonging to each of two adjacent first bonding pads 1 are arranged parallel to each other. Therefore, short circuit between the first bonding pads 1 can be avoided effectively even if the array substrate deforms. Similarly, directly adjacent first side edge and second side edge respectively belonging to each of two adjacent second bonding pads 2 can also be arranged parallel to each other. Therefore, short circuit between the second bonding pads 2 can be avoided effectively during the bonding process. Moreover, if a deformation of outward extension along the X direction occurs in the array substrate, the interval between the adjacent first bonding pads 1 is increased. In such a situation, since the shapes of the second bonding pads 2 are the same with the shapes of the first bonding pads 1, the second side edge of the first bonding pad 1 is parallel to the second side edge of the corresponding second bonding pad 2, therefore short circuit between a second bonding pad 2 and an adjacent first bonding pad 1 can be avoided. If a deformation of inward contraction along the X direction occurs in the array substrate, the interval between the adjacent first bonding pads 1 is decreased, since the interval between the adjacent first bonding pads 1 should be greater than zero. In such a situation, since the shapes of the second bonding pads 2 are the same with the shapes of the first bonding pads 1, the second side edge of the first bonding pad 1 is parallel to the second side edge of the corresponding second bonding pad 2, therefore short circuit between a second bonding pad 2 and an adjacent first bonding pad 1 can be avoided.

The third side edge and the fourth side edge of each first bonding pad 1 on the array substrate are parallel to each other. The third side edge and the fourth side edge of each second bonding pad 2 on the chip on film are also parallel to each other. A shape of parallelogram is then defined between two adjacent first bonding pads 1, and a shape of parallelogram is then defined between two adjacent second bonding pads 2. Such an arrangement is convenient for the manufacturing process. Certainly, the third side edge and the fourth side edge of each first bonding pad 1 can be arranged in a non-parallel arrangement, the third side edge and the fourth side edge of each second bonding pad 2 on the chip on film can also be arranged in a non-parallel arrangement.

Optionally, the third side edges of all the first bonding pads 1 on the array substrate are located on a straight line, the fourth side edges of all the first bonding pads 1 are located on another straight line. Accordingly, the third side edges of all the second bonding pads 2 on the chip on film are located on a straight line, the fourth side edges of all the second bonding pads are located on another straight line. With such an arrangement, the first bonding pads 1 and the second bonding pads 2 are arranged neatly. Since the first bonding pads 1 are arranged in the bonding area Q2 of the array substrate, a narrow frame for the display device can be realized. Certainly, the first bonding pads 1 can also be arranged based on the shape of the array substrate, the arrangement of the second bonding pads 2 can also be adjusted accordingly.

Optionally, the substratum for the array substrate is a flexible substratum. That is, the array substrate and the chip on film provided by the embodiment can be applied in a flexible display, since the flexible substratum has a tolerance for deformation.

The display device according to the embodiment of the invention can be any product or component with display function, such as liquid crystal panel, electronic paper, OLED panel, mobile phone, tablet computer, TV, display, notebook computer, digital photo frame and navigator.

An embodiment of the present invention also provides an electronic equipment. The electronic equipment includes the substrate and the chip on film in the abovementioned embodiments. The substrate is bonded to the plurality of second bonding pads of the chip on film through the plurality of first bonding pads. The shapes and distribution of the plurality of first bonding pads are the same with the shapes and distribution of the plurality of second bonding pads respectively.

Optionally, the first direction and the third direction are the same, the second direction and the fourth direction are the same.

Optionally, the substrate is an array substrate or a touch control substrate.

The advantages of this structure have been described in detail in the previous embodiments, which is not repeated herein.

The above embodiments are only used for explanations rather than limitations to the present invention, the ordinary skilled person in the related technical field, in the case of not departing from the spirit and scope of the present invention, may also make various modifications and variations, therefore, all the equivalent solutions also belong to the scope of the present invention, the patent protection scope of the present invention should be defined by the claims.

What is claimed is:

1. A substrate comprising a plurality of first bonding pads arranged side by side along a first direction; each first bonding pad having a left side edge and a right side edge arranged oppositely and arranged along the first direction, a top side edge and a bottom side edge arranged oppositely and arranged along a second direction perpendicular to the first direction; the left first side edge and right side edge of each first bonding pad being not parallel to each other;
   wherein for any two directly adjacent first bonding pads, the left side edge of the first bonding pad on the right is parallel to the right side edge of the first bonding pad on the left;
   wherein both the left side edge and the right side edge of each first bonding pad have a straight line shape; along an extending direction of each first bonding pad, a width of the first bonding pad in a direction perpendicular to the extending direction gradually increases.

2. The substrate according to claim 1, wherein the top side edge and the bottom side edge of each first bonding pad are parallel to each other.

3. The substrate according to claim 1, wherein the top side edges of all the first bonding pads are located on a straight line, the bottom side edges of all the first bonding pads are located on another straight line.

4. The substrate according to claim 1, wherein a substratum for the substrate is a flexible substratum.

5. The substrate according to claim 1, wherein the substrate is an array substrate.

6. The substrate according to claim 1, wherein the substrate is a touch control substrate.

7. A chip on film comprising a plurality of second bonding pads arranged side by side along a third direction; each second bonding pad having a left side edge and a right side edge arranged oppositely and arranged along the third direction, a top side edge and a bottom side edge arranged oppositely and arranged along a fourth direction perpendicular to the third direction; the left side edge and right side edge of each second bonding pad being not parallel to each other;
    wherein for any two directly adjacent second bonding pads, the left side edge of the second bonding pad on the right is parallel to the right side edge of the second bonding pad on the left;
    wherein both the left side edge and the right side edge of each second bonding pad have a straight line shape; along an extending direction of each second bonding pad, a width of the second bonding pad in a direction perpendicular to the extending direction gradually increases.

8. The chip on film according to claim 7, wherein the top side edge and the bottom side edge of each second bonding pad are parallel to each other.

9. The chip on film according to claim 7, wherein the top side edges of all the second bonding pads are located on a straight line, the bottom side edges of all the second bonding pads are located on another straight line.

10. An electronic equipment comprising a substrate and a chip on film; the substrate comprising a plurality of first bonding pads arranged side by side along a first direction; each first bonding pad having a left side edge and a right side edge arranged oppositely and arranged along the first direction, a top side edge and a bottom side edge arranged oppositely and arranged along a second direction perpendicular to the first direction; the left side edge and right side edge of each first bonding pad being not parallel to each other;
    the chip on film comprising a plurality of second bonding pads arranged side by side along a third direction; each second bonding pad having a left side edge and a right side edge arranged oppositely and arranged along the third direction, a top side edge and a bottom side edge arranged oppositely and arranged along a fourth direction perpendicular to the third direction; the left side edge and right side edge of each second bonding pad being not parallel to each other;
    wherein for any two directly adjacent first bonding pads, the left side edge of the first bonding pad on the right is parallel to the right side edge of the first bonding pad on the left;
    wherein both the left side edge and the right side edge of each first bonding pad have a straight line shape; along an extending direction of each first bonding pad, a width of the first bonding pad in a direction perpendicular to the extending direction gradually increases;
    wherein the substrate is bonded to the plurality of second bonding pads of the chip on film through the plurality of first bonding pads; and wherein the shapes and distribution of the plurality of first bonding pads are the same with the shapes and distribution of the plurality of second bonding pads respectively.

11. The electronic equipment according to claim 10, wherein the first direction and the third direction are the same, the second direction and the fourth direction are the same.

12. The electronic equipment according to claim 10, wherein the substrate is an array substrate or a touch control substrate.

* * * * *